June 16, 1964

L. KATZ 3,137,342

HEAT RADIATOR

Filed May 24, 1961

INVENTOR.
Leonhard Katz
BY
Roberts, Cushman & Grover
ATT'YS

1

3,137,342
HEAT RADIATOR

Leonhard Katz, Woburn, Mass., assignor to Astro Dynamics, Inc., Burlington, Mass., a corporation of Massachusetts Filed May 24, 1961, Ser. No. 112,340
5 Claims. (Cl. 165—80)

This invention relates to heat radiators and more particularly to radiators for small heat-producing electronic components such as transistors.

Some thought has been given previously to providing heat radiators for high power transistors and also to providing means for producing a thermally conductive junction between various types of transistors and the metal chassis which is typically associated with electronic apparatus. However, there are some instances, as where miniaturization of electronic equipment is attempted, in which even the heat produced by relatively small transistors may create a problem and where there is no metal chassis which may be used as an auxiliary radiating surface. A prime example of the latter situation is where so-called printed circuit boards are employed. To serve their function these boards must be electrically insulating and the materials suitable for this purpose are also typically poor heat conductors.

Accordingly, objects of the present invention are to provide a heat radiator for relatively lower power transistors which may be used with printed circuit boards.

Further objects are to provide such a radiator which includes a large surface area for giving off heat to convection currents, which has a low thermal resistance immediately adjacent the transistor, which yields a highly conductive junction with the transistor itself, which is compact and of light weight, and which is of simple and inexpensive manufacture.

In the attainment of these objects the invention contemplates a heat radiator which will stand away from the printed circuit board or other assembly with which the transistors are to be used and which will cool a transistor by natural convection.

In one aspect the radiator comprises a base, an upstanding body part having means for the attachment of a transistor, and a plurality of fins projecting from the body part.

In another aspect all sections through the radiator parallel to a given plane are similar whereby the radiator may be manufactured largely by extrusion.

For purposes of illustration preferred embodiments of the present invention are shown in the accompanying prints in which FIG. 1 is a front elevation of a heat radiator;

Figure 1:
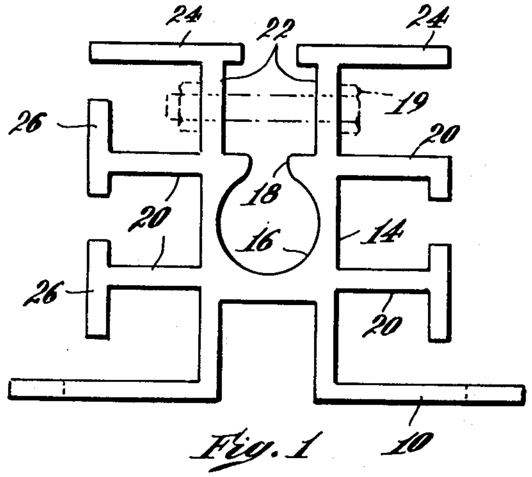
Figure 2:
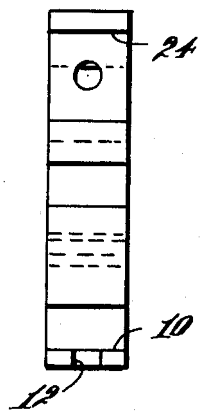
FIG. 2 is a side elevation of the radiator.
Figure 3:
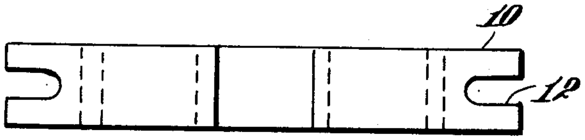
FIG. 3 is a bottom view of the radiator.

Referring now to the drawings the radiator shown in FIGS. 1–3 has a base 10 by which it may be mounted on a printed circuit board or other substantially plane surface. For this purpose the ends of the base are notched as at 12 for receiving suitable bolts or rivets. Upstanding from the base 10 is a body part 14 which contains an aperture 16 for receiving the case of a transistor. Preferably the

2 body part 14 is split along one side of the aperture 16, as at 18, so that it may resiliently grasp a transistor thereby forming a junction of low thermal resistance. If desired a bolt 19 (shown in broken lines) may be provided for drawing the body part 14 even tighter about a transistor.

A pair of fins 20 project laterally from each side of the body part 14 and a pair of fins 22 project upwardly from the top of the body part. Each of these fins is terminated by a transverse flange, the vertical fins 22 by horizontal flanges 24 and the horizontal fins 20 by vertical flanges 26.

It is an advantage of the present invention that, except for the mounting provisions, the structure as thus far described may be manufactured by the relatively inexpensive process of extrusion. All sections taken parallel to a given plane are similar and the axis of the cylindrical aperture 16 and the width of the various fins and flanges being perpendicular to that plane. Further, this extrusion can be accomplished using aluminum or an aluminum alloy, such materials having both high conductivity and high strength with respect to their weights.

Figure 4:
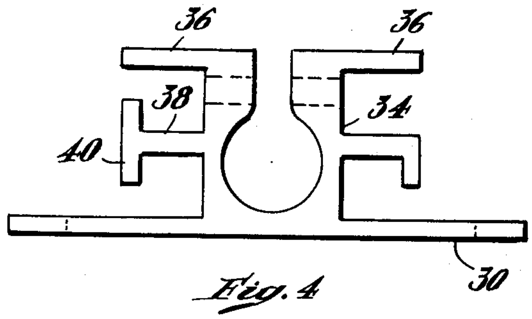
FIG. 4 is a front elevation of a modification.
Figure 5:
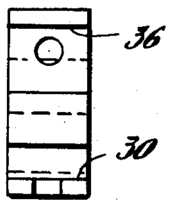
FIG. 5 is a side elevation of the modification.

FIGS. 4 and 5 show a modification of more compact design and having a correspondingly lower heat dissipating capacity. This modification also includes a base 30 and an upstanding body part 34 but has fewer heat radiating fins. There are a pair of fins 36 projecting laterally from along the top of the body part 34 and a single fin 38 projects laterally from each of its sides. Only the fins 38 terminate in transverse flanges 40. This radiator too possesses the advantage that it may be manufactured largely by extrusion.

Figure 6:
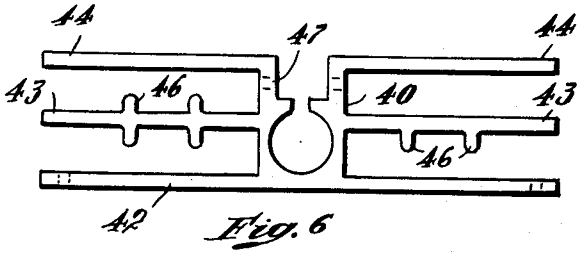
FIG. 6 is a front elevation of a further modification.

FIG. 6 shows a modification suitable for use when the projection of the radiator beyond the surface on which it is mounted must be reduced to a minimum. Though of shortened height this modification also has an upstanding body part 40 projecting from a base 42. Two comparatively long fins 43, 44 project from each side of the body part 40. The fins 43 include a plurality of transverse fins 46 which increase the heat radiating surface without increasing the radiator's over-all dimensions. The transverse fins are omitted from the upper side of the right-hand fin 43 so as to provide access to bolt holes 47. Again the entire radiator can be manufactured largely by extrusion.

It should be understood that this disclosure is for the purpose of illustration only and that the present invention includes all modifications and equivalents falling within the scope of the appended claims.

I claim:

1. A heat radiator for a transistor, comprising a single piece of metal of uniform thickness, said piece having a flat, elongated, rectangular base and at one side of said base, centrally thereof, a pair of arms extending perpendicularly therefrom, said arms being joined adjacent said base and being spaced apart away from said base, opposed surfaces of said arms defining a cylindrical opening extending from the junction of said arms with the axis of the opening parallel to the plane of said base in the direction of said thickness, said arms converging to a gap at the side of said opening remote from said base, said arms having a plurality of fins extending outwardly therefrom parallel to said base, whereby said base may be mounted upon a chassis and a transistor may be inserted within said opening and gripped resiliently by said arms.

2. The radiator of claim 1, at least some of said fins having flanges perpendicular thereto.

3. The radiator of claim 1, said arms having means at said remote side of said opening for drawing said arms together where they are spaced apart.

4. The radiator of claim 1, the cross-sections of said radiator at parallel planes perpendicular to the thickness dimension being substantially identical.

5. The radiator of claim 1, said base comprising a plate having a mounting opening therein, said arms having aligned openings therethrough at said remote side to receive a bolt for drawing said arms toward each other where they are spaced apart.

References Cited in the file of this patent

UNITED STATES PATENTS

| | | |
|---|---|---|
| 2,772,382 | Escoffery | Nov. 27, 1956 |
| 2,936,409 | Jackson et al. | May 10, 1960 |
| 2,947,957 | Spindler | Aug. 2, 1960 |